United States Patent [19]

Sloane et al.

[11] 4,047,002
[45] Sept. 6, 1977

[54] LAPLACE TRANSFORM SYSTEM

[75] Inventors: Edwin A. Sloane, Los Altos; Bruce T. McKeever, Mountain View; Eugene Wong, Berkeley, all of Calif.

[73] Assignee: Time/Data Corporation, Santa Clara, Calif.

[21] Appl. No.: 700,446

[22] Filed: June 28, 1976

Related U.S. Application Data

[63] Continuation-in-part of Ser. No. 552,655, Feb. 24, 1975, abandoned, which is a continuation of Ser. No. 389,510, Aug. 20, 1973, abandoned.

[51] Int. Cl.² .................... G01R 23/16; G01R 27/02; G06F 15/34
[52] U.S. Cl. ................ 235/151.3; 235/151.31; 235/156; 324/77 B; 324/57 Q
[58] Field of Search ............... 235/151.3, 151.31, 181, 235/183, 182, 152, 156; 324/57 R, 57 PS, 57 Q, 77 B, 77 G, 73 R, 73 AT; 444/1

[56] References Cited

U.S. PATENT DOCUMENTS

| | | | |
|---|---|---|---|
| 3,393,301 | 7/1968 | Valstar | 235/151.31 |
| 3,526,832 | 9/1970 | Post | 235/181 X |
| 3,674,998 | 7/1972 | Benz | 235/151.31 |
| 3,718,813 | 2/1973 | Williams, Jr. | 235/151.3 X |
| 3,764,995 | 10/1973 | Helf, Jr. | 235/151.31 X |

Primary Examiner—Joseph F. Ruggiero

[57] ABSTRACT

A system for determining the location of poles in the complex s-plane and their residues from empirical data is disclosed. The system utilizes the impulse response or similar data of a specimen and through repeated differentiations of a frequency domain representation of this response locates the frequency of the poles. The results of any two consecutive differentiations are used to determine the location of the poles in the s-plane and their residues.

33 Claims, 8 Drawing Figures

LAPLACE TRANSFORM SYSTEM

This is a continuation-in-part of application, Ser. No. 552,655, filed Feb. 24, 1975, now abandoned which is a continuation of application, Ser. No. 389,510, filed Aug. 20, 1973 and now abandoned.

BACKGROUND OF THE INVENTION

1. Field of the Invention

The invention relates to the field of methods and systems for locating poles and their residues of specimens from impulse responses and related fields of resonance testing.

2. Prior Art

In many fields it is desirable to have a modal analysis of a specimen or object or to know: the resonant frequencies of the specimen or object, or more particularly to know the natural resonant frequencies and their associated damping which is given by the $s$-plane location of the poles; the state of the system which is given by the complex residues associated with these frequencies. Such information is invaluable for damping large machinery, for structural and flutter analysis and for countless other applications.

For all but the simplest structures, it is generally impractical to obtain a theoretical transfer function or more particularly, a meaningful theoretical location of the poles and their residues. Ideally, the poles and their residues should be determined from empirically derived functions or qualities that are readily measurable or obtainable from the specimen. For example, the location of the poles in the $s$-plane and their residues should ideally be determinable from some time domain function, such as the impulse or transient response of the specimen.

In the prior art, several methods exist for obtaining the location of the poles in the $s$-plane and their residues from empirical information, such as impulse response or from a frequency domain representation of the impulse response, such as the Fourier transform of the response. Most, if not all, of these prior art techniques and methods require the use of judgment and provide no straightforward means for determining the required $s$-plane information. Among the prior art methods and techniques are:

1. Kennedy-Pancu Method, which utilizes curve fitting techniques, Journal of Aeronautical Science, Volume 14, 603-625 (1947).

2. A method disclosed by James C. Davis in an article entitled *Modal Modeling Techniques for Vehicle Shake Analysis*, Automotive Engineering Congress, Detroit, Michigan, Jan. 10-14 1972, No. 720045.

3. A method for experimental determination of the poles of a structure by multiple shaker excitation disclosed by R. Lewis and D. Wrisley in an article entitled, *A System For The Excitation of Pure Natural Modes of Complex Structure*, Journal of Aeronautical Sciences, Vol. 17, No. 11, November 1950, Pages 705-723.

4. A general survey article which discusses the problem is *An Investigation into the Theory of Resonance Testing*, by Bishop and Gladwell, Philosophical Transactions of the Royal Society of London, Volume 255, January 1963, pages 241-280.

SUMMARY OF THE INVENTION

A system for determining the location of poles in the $s$-plane and their residues for a specimen is described. The determination is made utilizing empirically sensed information, such as in the presently preferred embodiment, the impulse response of the specimen. The impulse response $h(t)$ is multiplied by a known function and the square of the function, which in the presently preferred embodiment is a sine function $x(t)$ forming the quantities $$x(t) \cdot h(t) \text{ and } x^2(t) \cdot h(t)$$

A Fourier transform is taken of these quantities resulting in $$\Delta'\{H(\omega)\} \text{ and } \Delta^2\{H(\omega)\}$$

The latter of these quantities is displayed, permitting the frequencies of the poles to be identified. The interaction between the poles is reduced due to the sharpening of the poles caused by the multiplication in the time domain which effectively is a differentiation by convolution in the frequency domain. From a relatively simple calculation the $\sigma$ coordinate (real part of $s$) of the poles may be determined in addition to the residues of the poles. This calculation utilizes the results of any two successive frequency domain differentiations or convolutions, such as $$\Delta'\{H(\omega)\} \text{ and } \Delta^2\{H(\omega)\}$$

DETAILED DESCRIPTION OF THE INVENTION

Throughout this patent reference is made to the $s$-plane location of poles. The $s$ designates the commonly utilized symbol for the exponent utilized in the Laplace transform: where $s$ is equal to $\sigma + j\omega$. The location of a pole refers to the specific resonant frequency $(f)$ or angular frequency $\omega = 2\pi f$ and $\sigma$, the damping rate, at which the peak or pole occurs and the residue refers to the magnitude $|k|$ of the pole which specifies the initial magnitude or gain of the resonance and the phase angle $\angle K$ which specifies the initial phase of the impulse response associated with that pole. While the following explanation is specifically oriented towards the poles in the s-plane, it will be apparent to one skilled in the art that the disclosure is equally applicable for the determination of zeroes. The emphasis, for the purposes of description in this patent, is oriented towards the determination of the positive frequencies or positive $\omega$'s rather than the negative frequencies because the negative frequency pole descriptions are simply the complex conjugate of the poles in the upper half (positive frequency) s-plane. It will be apparent that $\sigma$ may be positive, as in the case of an unstable condition, or negative, as in the case of a damped condition. Reference is also made throughout the specification to the Fourier transform which is defined as follows:

$$F(j\omega) = \int_0^T f(t) e^{-j\omega t} dt$$

Figure 4A:
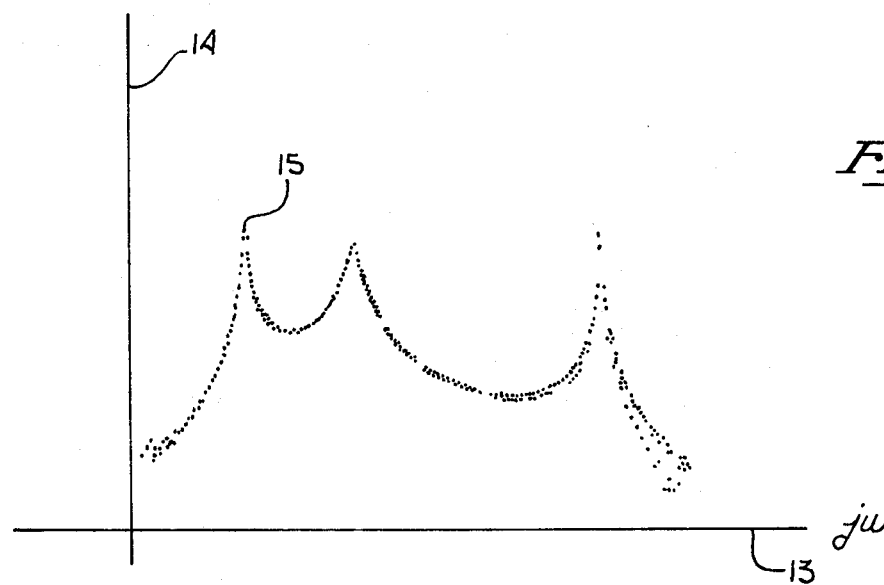
FIG. 4a is a graph of a function which illustrates the Fourier transform of an impulse or transient response of a specimen.

In order to better appreciate the problem solved by the present invention, reference is made to the drawing shown in FIG. 4a. This drawing represents the Fourier transform of the impulse response of a specimen. The abscissa 13 represents the $j\omega$ axis while the ordinate 14 represents the amplitude of the Fourier coefficients. As will be explained later, because of the limited dynamic range of the display media, the amplitudes are scaled (by a logarithmic function) before being displayed. On first examination of FIG. 4a, it may appear that the frequency at which the peaks occur, such as peak 15, is determinable directly from the abscissa 13. This is not the case in general since the interaction of the other peaks shown in FIG. 4a with peak 15 causes peak 15 to be shifted, thus, the actual $j\omega$ location of the pole associated with peak 15 is different than the value of $j\omega$ disposed beneath the peak on abscissa 13.

Figure 1:
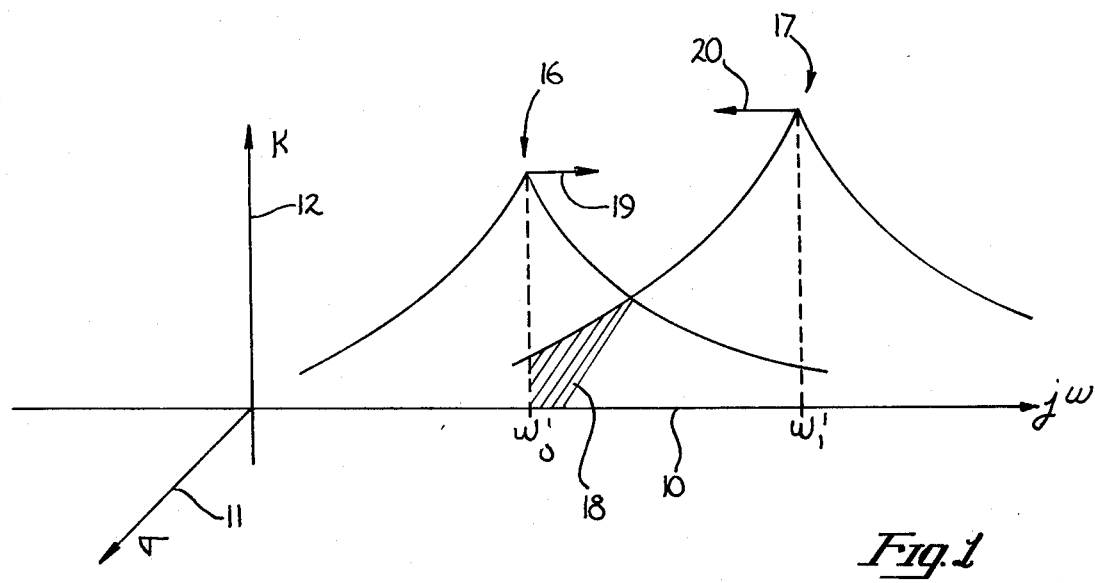
FIG. 1 is a graph used to illustrate the interaction of the poles in the $s$-plane. This diagram illustrates the difficulty encountered in attempting to locate the resonant frequencies from a frequency domain representation of an impulse or transient response along the $j(\omega)$ axis.
Figure 4B:
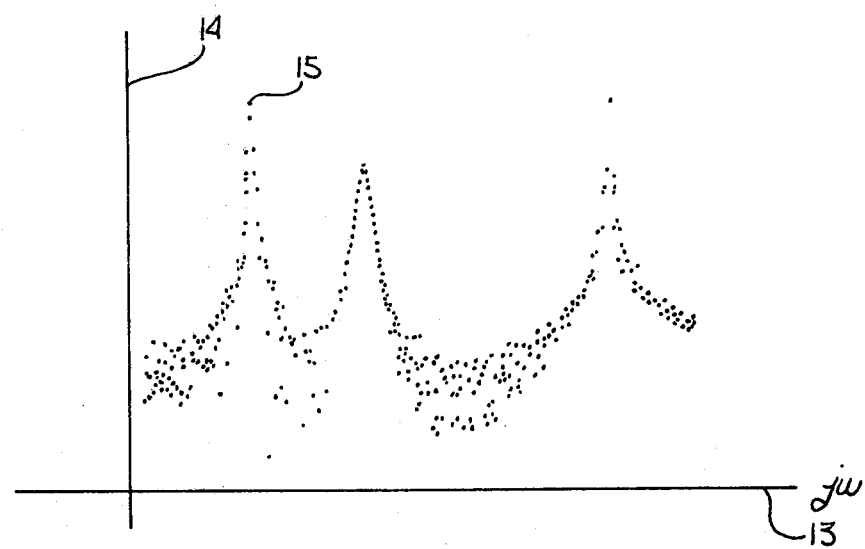
FIG. 4b illustrates the function of FIG. 4a after the function has been sharpened or differentiated.
Figure 4C:
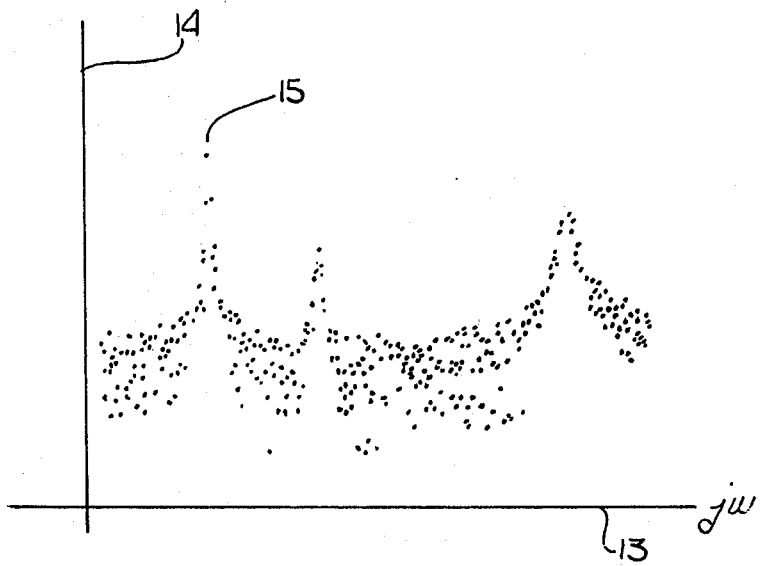
FIG. 4c illustrates the function of FIG. 4a after the second differential has been taken.

Referring to FIG. 1, the shifting of the peak locations along the $j\omega$ axis 10, which is caused by the interaction of the poles, i graphically illustrated. Poles 16 and 17 are illustrated within the coordinate system which comprises the $j\omega$ axis 10, the $\sigma$ axis 11 and the K axis 12. For the purposes of explanation, both poles 16 and 17 are assumed to have a location which corresponds to negative values of $\sigma$. The pole 16 appears to be located along the $j\omega$ axis at $\omega_0'$ while the pole 17 appears to be located along the same axis at $\omega_1'$. The contribution to the apparent location of pole 16 along the $j\omega$ axis caused by the skirt of pole 17 (shown as shaded area 18) causes the apparent location of pole 16 to be moved in the direction indicated by arrow 19. Likewise, the skirt of pole 16 causes the apparent location of pole 17 along the $j\omega$ axis to be shifted in the direction indicated by arrow 20. Thus, an examination of the Fourier transform of a time domain function does not yield an accurate location of the poles along the $j\omega$ axis. As will be seen, in the present invention, the Fourier transform is "sharpened" through differentiation by convolution in order to minimize the interaction between poles and allow an accurate determination of the resonant frequencies. In FIG. 4b the first differential of the data shown in FIG. 4a is illustrated and it can be readily seen that the peaks are much steeper, thereby eliminating some of the interaction between the poles. In FIG. 4c, the second differential of the data illustrated in 4a is shown. In this figure the slopes of the poles are considerably steeper than the slopes shown in FIG. 4b, thereby further eliminating interaction between the poles and permitting a more accurate determination of the frequency of the poles to be determined.

First, a mathematical explanation of a portion of the invented system shall be given since it will aid in an understanding of the system. It is known that the effective magnitude of a pole at any point in the s-plane is equal to the maximum magnitude of the residue, $|K|$, of a pole divided by the distance from the pole. Thus, the magnitude of the Fourier transform of a pole which occurs at $\sigma_0 + j\omega_0$ may be written as:

$$|H(\omega)| = \frac{|K_o|}{\sqrt{\sigma_o^2 + (\omega - \omega_o)^2}} \quad (1)$$

where $\tau_0$ is equal to the location of the pole along the $\tau$ axis, and where $\omega_0$ is the angular frequency at which the expression is evaluated. A similar expression may be written for each pole which appears along the $j\omega$ axis. The first derivative of equation (1) may be written as;

$$|H'(\omega)| = \frac{\mu_1 |K_o|}{\sigma_o^2 + (\omega - \omega_o)^2} \quad (2)$$

where $\mu_1$ represents a correction factor which may be required where $H(\omega)$ is not a continuous function but rather represents a finite number of samples. In the theoretical case where $H(\omega)$ is a continuous function, $\mu_1$ would be equal to unity. The second derivative of equation (1) may likewise be written as follows:

$$|H''(\omega)| = \frac{\mu_2 |K_o|}{[\sigma_o^2 + (\omega - \omega_o)^2]^{3/2}} \quad (3)$$

where $\mu_2$ again is a correction factor which may be required where $H(\omega)$ is not a continuous function. In general terms the lth derivative may be written as:

$$|H^l(\omega)| = \frac{\mu_l |K_o|}{[\sigma_o^2 + (\omega - \omega_o)^2]^{\frac{l+1}{2}}} \quad (4)$$

where $\mu_l$ is again a correction factor.

As previously mentioned and as illustrated in FIGS. 4b and 4c, the sharpening process that occurs by the differentiation of the frequency domain representation reduces the interaction between the poles. For the $l^{th}$ derivative the apparent location of the pole along the $j\omega$ axis will substantially coincide with the actual location of the pole along that axis. Therefore, the expression $(\omega - \omega_0)$ approaches zero since the frequency at which the expression will be evaluated is the frequency corresponding to $\omega_0$. Neglecting the term $(\omega - \omega_0)$ (or letting $\omega = \omega_0$) in equations (2) and (3) yields the following two equations.

$$|H'(\omega_o)| = \frac{\mu_1 |K_o|}{\sigma_o^2} \quad (5)$$

$$|H'(\omega_o)| = \frac{\mu_2 |K_o|}{\sigma_o^3} \tag{6}$$

In a similar manner expressions may be written for all the poles.

If the magnitude of the first derivative $H'(\omega)$ is divided by $H''(\omega_0)$ the second derivative as follows:

$$\frac{|H'(\omega_o)|}{|H''(\omega_o)|} = \frac{\mu_1}{\mu_2} \sigma_o \tag{7}$$

the $\sigma_0$ location of the pole may be determined.

The ratio of the first derivative cubed and the second derivative squared results in the following equation:

$$\frac{|H'(\omega_o)|^3}{|H''(\omega_o)|^2} = \frac{\mu_1^3}{\mu_2^2} |K_o| \tag{8}$$

From this equation the magnitude of the pole may be determined or for that matter the magnitude of all the poles located along the $j\omega$ axis may be determined.

In equations (7) and (8) the ratios of the first and second derivatives were utilized although any other two derivatives may be used to compute $|K_0|$ and $\sigma_0$ such as the first and third derivations. In the presently preferred embodiment two consecutive derivatives are used such as the first and second, since the use of consecutive derivatives simplifies the computation. Other consecutive derivatives could be used, such as the third and fourth derivatives, or the fourth and fifth derivatives.

All that remains to be computed now is the remainder of residue, that is the phase angle associated with the magnitude.

By a similar analysis to that discussed in conjunction with equations (1) and (2), the following equation may be written:

$$\underline{/H'(\omega)} = \left[ K_o - \frac{\pi}{2} + \arctan\left( \frac{\omega - \omega_o}{\sigma_o} \right) \right] \tag{9}$$

where $K_0$ is equal to the phase angle associated with the pole located at $\omega_0$ and $\sigma_0$ and where $\underline{/H'(\omega)}$ is the phase angle of the differentiated Fourier transform at the evaluating $\omega$. The phase of the second derivative may likewise be written as:

$$\underline{/H''(\omega)} = \left[ K_o - \pi + 2 \arctan\left( \frac{\omega - \omega_o}{\sigma_o} \right) \right] \tag{10}$$

and the general $l^{th}$ derivative may be written as:

$$\underline{/H^l(\omega)} = \left[ K_o - l\frac{\pi}{2} + l \arctan\left( \frac{\omega - \omega_o}{\sigma_o} \right) \right] \tag{11}$$

From equations (9) and (10) the expression may be written:

$$\underline{/K_o} = 2 \underline{/H'(\omega_0)} - \underline{/H''(\omega_0)} \tag{12}$$

The arctangent terms of equations (9) and (10) is cancelled and thus this term need not be computed to determine the phase angle. In a similar manner all the phase angles may be computed. In the preceding calculation the first and second derivatives of the frequency domain representation were again utilized and as in the case of computing K and $\sigma$ any other two consecutive derivatives such as the fourth and fifth derivative, could have been used.

Thus, by the above theoretical analysis, it has been shown that the location of the pole along the $j\omega$ and $\delta$ axes may be determined in addition to the residue of the pole ($|K|$ and $\underline{/K}$).

Figure 2:
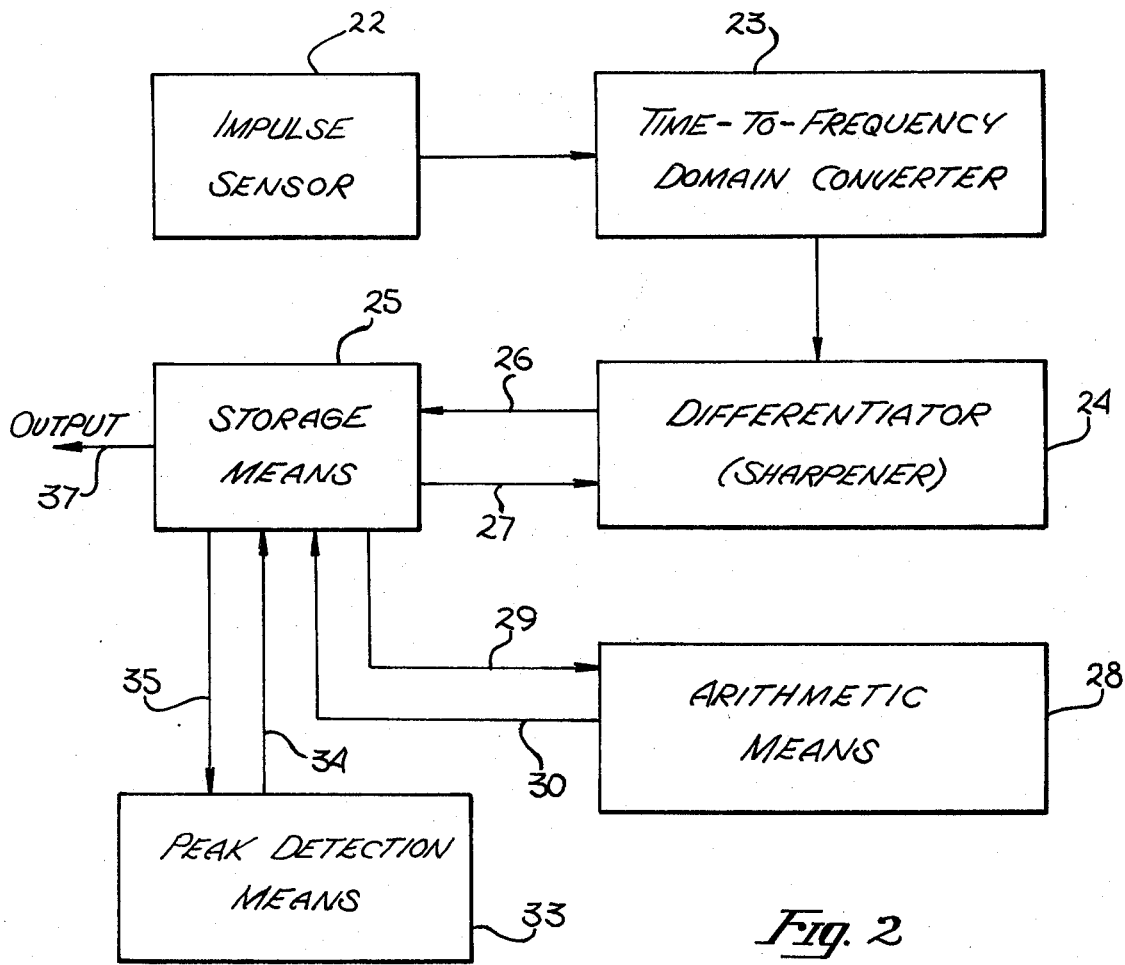
FIG. 2 is a general block diagram used to illustrate the structure and method by which the location of the poles and their residues are determined by the present invention.

Referring to FIG. 2, a generalized block diagram for performing the above described calculations is illustrated. An impulse sensor 22 is utilized to sense the impulse or transient response of the specimen and communicates this response to the time-to-frequency domain converter 23. Impulse sensor 22 may be any one of a plurality of known sensor means such as electromechanical means, optical means or the like. The time-to-frequency domain converter may include any known means for converting a time domain representation to a frequency domain representation. A computer for performing this function and for converting the time domain information into Fourier coefficients is disclosed in U.S. Pat. No. 3,638,004. The frequency domain representations from converter 23 are communicated to differentiator 24 where the information is "sharpened" as is illustrated in FIGS. 4b and 4c. Numerous known circuits are available for performing the differentiation function both in analog form and in digital form. The results of each differentiation are communicated by lead 26 to storage means 25. Storage means 25 may be any one of a plurality of random access memory means such as those fabricated from magnetic cores or semiconductor devices. Storage means 25 may communicate stored data to differentiator 24 via lead 27.

The storage means 25 is also coupled to arithmetic means 28 such that information may flow from the storage means to the arithmetic means 28 via lead 29 and such that information may be returned to the storage means from the arithmetic means 28 via lead 30. Arithmetic means 28 may be a general purpose digital computer programmed to perform the above described computations or it may be a hard-wired computer wired to perform the specific computations above described.

The peak detection means 33 is coupled to the storage means 25 such that information may flow from the storage means to the peak detection means on lead 35 and likewise information may flow from the peak detection means 33 back to the storage means 25 via lead 34. The peak detection means 33 is utilized to determine the $j\omega$ location of the poles, such as the poles illustrated in FIG. 4c. Thus, the storage means 25 communicates a derivative of the frequency domain representation of the signal sensed by sensor 22 such as the second, third or fourth derivative to the peak detection means 33. The $j\omega$ location of each of the peaks is returned via lead 34 to a storage means. Numerous prior art circuits are disclosed for detecting amplitude peaks and for providing the required information. Note that because of the sharpening which results from the differentiation, it is not difficult to distinguish the peaks and to accurately locate their frequencies.

The operation of the system represented by FIG. 2 may be readily understood in conjunction with the above described equations. First, the impulse sensor 22 senses the impulse response of the system and communicates this response to the converter 23. Converter 23 performs a Fourier transform or other transform on the data and forms the quantity H ($\omega$). This information is conveyed to differentiator 24 where it is differentiated and the results of the differentiation are then stored in storage means 25. The results of the first differentiation are returned to differentiator 24 by lead 27 whereupon differentiator 24 performs a second differentiation, the results of which are returned on lead 26 and stored in storage means 25. As previously explained, this differentiation process may continue since any two consecutive differentiations, for example, the fourth or fifth, may be utilized. Once the results of the differentiations, such as H'($\omega$) and H"($\omega$) have been stored in storage means 25, the computation of the $|K|$ values, $\sigma$ values and phase angles may begin.

With the results of the differentiation stored in storage means 25, the $\sigma$ values and $|K|$ values shown in equations (7) and (8), respectfully, may be readily solved by the arithmetic means 28. Note that these computations require only relatively simple mathematical operations. As will be explained in more detail in conjunction with FIG. 3, the $\sigma$ values and K values are computed for each and every value of $\omega$ and stored within means 25. The correction factors ($\mu_1$ and $\mu_2$) previously discussed, when needed, may likewise be stored within means 25 and used to correct the $\sigma$ values and K values. Following this, the phase angle associated with each of the K values may be calculated by arithmetic means 28 by solving equation (12) above, this, once again, is a relatively simple calculation and the phase angle is computed for each and every value of K.

Following the computation of all values of $\sigma$, K and the phase angle, a derivative of H($\omega$) is communicated to peak detection means 33 via lead 35. Preferably, the highest order derivative is utilized, for example, the second derivative shown in FIG. 4b is communicated to the peak detection means 33. Within the peak detection means 33 the frequencies at which the peaks occur may be readily determined as previously explained. The $j(\omega)$ which correspond to these frequencies are then returned to storage means 25 via lead 34. The $\sigma$, $|K|$ and phase angle which correspond to the values of $j(\omega)$ detected by means 33 represent the location of the poles and the residues for the signal sensed by sensor 22 and are then communicated to the output lead 37.

As mentioned, the values of $|K|$, $\sigma$ and the phase angle were calculated for each and every $\omega$ and then the values of $\sigma$, $\omega$ and phase angle for each pole are selected for storage means 25. The computation may be shortened where desired by computing the values of $|K|$, $\sigma$ and the phase angle for only those values of $j\omega$ at which the peaks occur. This would require the detection of the peaks by means 33 prior to the computation of $\sigma$, $|K|$ and the phase angle within arithmetic means 28. In those instances where all the values of K, $\sigma$ and phase angle are computed, this computation may be performed within arithmetic means 28 simultaneously with the detection of the peaks within peak detection means 33.

Figure 3:
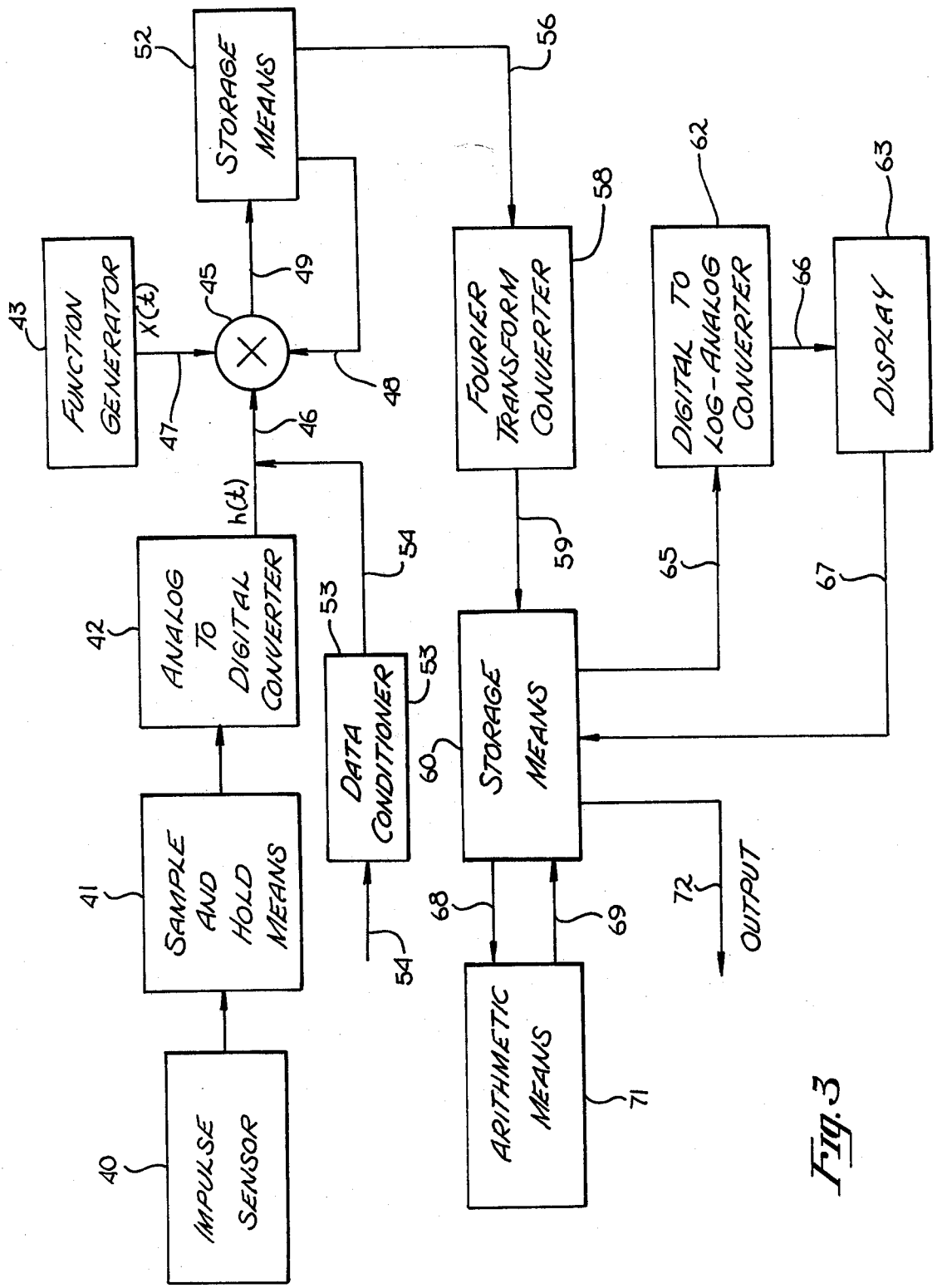
FIG. 3 is a block diagram illustrating the structure and method by which the location of the poles and their residues are determined in the presently preferred embodiment.

In order to more readily explain the operation of the presently preferred embodiment of the system illustrated in FIG. 3, some additional mathematical explanation shall be set forth. In the presently preferred embodiment the input signal, such as the impulse response, is sampled and hence a continuous function is not utilized. For purposes of explanation it will be assumed that the input signal is sampled N times and as will be seen, each sample is converted into digital form and computations are made within the system in digital form. Where a finite number of samples of the sensed or imput signal are utilized, the above described differentiation in the frequency domain is in effect a convolution in the frequency domain or a multiplication in the time domain. For example, assume that the time domain input function, such as the impulse response or transient response is a finite number of samples N and is represented by $h(t)$ and assume further that the Fourier transform of this signal is represented by H($\omega$). It may be seen that the first derivative of H($\omega$) may be written as:

$$H'(\omega) = F\{-jt \cdot h(t)\} \tag{13}$$

where $F$ represents the Fourier transform. Thus, the Fourier transform of $th(t)$ is equal to the first derivative in the frequency domain of $H(\omega)$. Likewise, the second derivative may be written as:

$$H''(\omega) = F\{t^2 h(t)\} \tag{14}$$

or the $l^{th}$ derivative may be written as:

$$H^l(\omega) = F\{-j^l t^l h(t)\} \tag{15}$$

From the above equations it may be seen that by multiplying h($t$) by $t$ or a ramp function, the differentiation operation is no longer required and the sharpening of the poles previously described may be performed by a multiplication in the time domain. While any one of a plurality of known functions may be utilized as a weighting function instead of $t$ for obtaining the convolution in the frequency domain, in the presently preferred embodiment a trigonometric function (sine function) is utilized. It has been found that with the use of a sine function the correction factor is close to unity and where required may be readily computed. This occurs since finite differencing is used in computing the values of $\sigma$, K and phase angle.

In more general terms where the trigonometric or weighting function is represented by $x(t)$ the following equation may be written:

$$F\{h(t) \cdot x^l(t)\} \rightarrow \Delta^l\{H(\omega)\} \tag{16}$$

where $\Delta^l\{\ \}$ represents the lth "differentiation" or convolution, and where $\Delta$ represents the finite central differencing operator.

$x(t)$ is represented by:

$$x(t) = \sin(\pi n \tau/T) \tag{17}$$

where $n$ is equal to 0, 1, 2, 3, ... N−1, T is the period of the input signal and $\tau$ is the sampling interval. From the above equations is may be shown that where the first and second convolutions are utilized the following expression applies:

$$\sigma = \ln\left[Z\left(\frac{\Delta^2\{H(\omega)\} + \Delta'\{H(\omega)\}\sin \pi/N}{\Delta^2\{H(\omega)\} - \Delta'\{H(\omega)\}\sin \pi/N}\right)\right] \tag{18}$$

where Z represents a correction factor and $ln$ is the natural logarithm. Similarly, an equation can be written for K in complex form, that is the magnitude and angle associated with the poles.

$$K = /K/ \underline{K} = \left[ \frac{e^{\sigma}(1 + 2e^{-\sigma} \cos \frac{\pi}{N} + e^{-2\sigma})}{(1 + e^{-N\sigma}) \sin \frac{\pi}{N}} \right] \cdot \Delta'\{H(\omega)\} \quad (19)$$

Referring to FIG. 3 and to the presently preferred embodiment of the invention impulse sensor 40, which may be similar to impulse sensor 22 of FIG. 2, is utilized to sense the impulse response of the specimen and to transmit that response to the sample and hold means 41. It will be appreciated that in some instances the impulse or transient response will be pre-recorded and will be applied directly to the sample and hold means if the pre-recording is in analog form, or if the pre-recording is in digital form it may be applied to lead 46. Sample and hold means 41 samples the response a finite number of times (N) and transmits each of the samples to the analog-to-digital converter 42. In converter 42 each of the samples are converted to digital form and are applied to lead 46. The output of the converter 42 corresponds to $h(t)$ shown in the above equations.

An additional input lead 54 is shown in FIG. 3 coupled to a data conditioner 53. Data conditioner 53 is utilized in those instances where the input to the system is in the form other than an impulse response or other transient response and is used to condition the data and convert it to a time domain function. The output of conditioner 53, lead 54, is applied to the multiplier 45 in lieu of data from converter 42 where the data requires conditioning. Examples of the type of data that may be applied to conditioner 54 are data representative of autocorrelation, cross-spectrum, autospectrum or a transfer function. In situations where the transfer function of cross-spectrum are used, this data may be converted to an impulse response. For those cases where the autospectrum or autocorrelation are furnished, these functions may likewise be converted to an appropriate time domain function by assigning a physically plausible phase function to the square root of the autospectrum or to the square root of the Fourier transform of the autocorrelation function. One criteria for assigning such a phase function is described in the discussion of *Minimum Phase Systems*, by H. Bode, Network Analysis and Feedback Amplifier Design, Van Nostrand Co., Inc., New York, N. Y., 1945.

Multiplier 45, which may be an ordinary digital multiplier, is adaptable for multiplying two digital signals and for producing a digital signal representative of the product on lead 49. Multiplier 45 is used to multiply pairs of digital signals provided on leads 46 and 47 or 47 and 48. Storage means 52, which is coupled to the output of multiplier 45, is adaptable for furnishing stored signals on lead 48 to multiplier 45 and on lead 56 to the Fourier transform converter 58. This storage means may be any one of numerous storage or memory means for storing digital information, such as semiconductor or magnetic core memories.

Function generator 43 is utilized to generate the weighting function which, as previously discussed, is the sine function. Function generator 43 generates this information in digital form and its output is coupled to multiplier 45 on lead 47.

Figure 6:
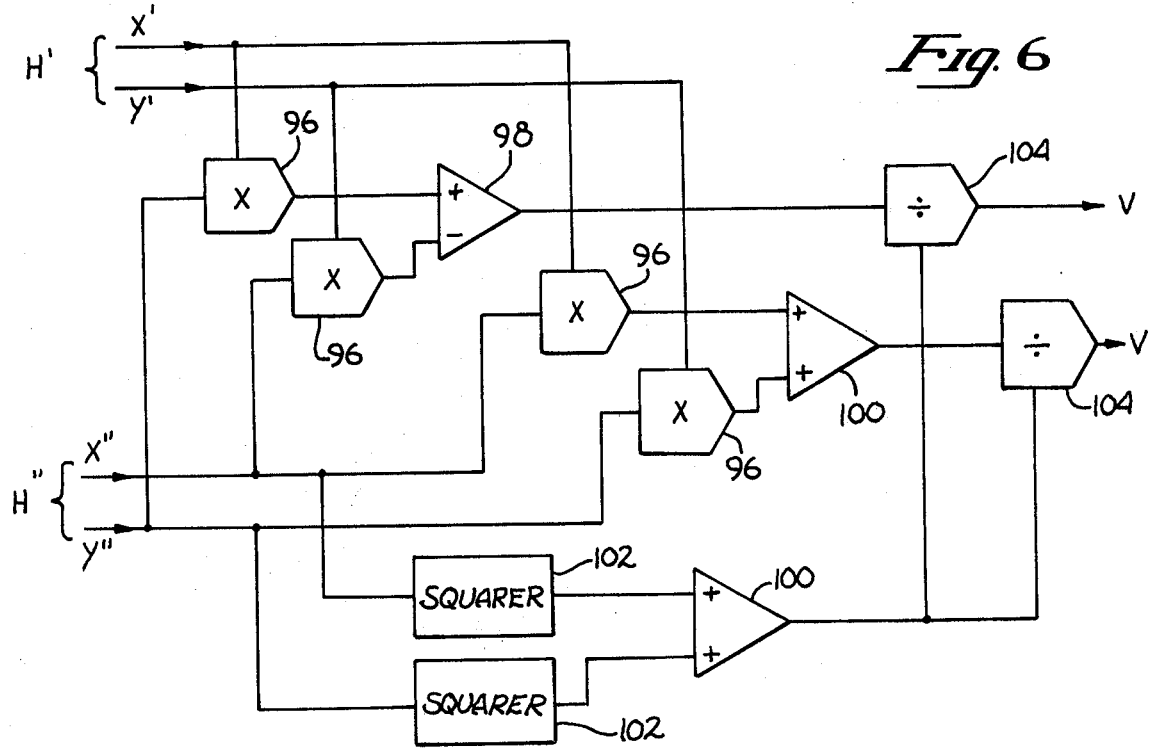
FIG. 6 is a general block diagram illustrating the structure and method by which greater accuracy can be achieved in the determination of the damping factor for lightly damped resonances.

The Fourier transform converter 58 may be any digital means for converting a time domain signal into a frequency domain signal and in the presently preferred embodiment comprises a hardwired computer described in U.S. Pat. No. 3,638,004. In FIG. 6 of this patent and in the specification there is disclosed a sample and hold means and analog-to-digital converter which may be utilized for sample and hold means 41 and converter 42 illustrated herein. Numerous other well known circuits may be utilized for means 41 and converter 42. Also in U.S. Pat. No. 3,638,004, in FIG. 7 and in the specification there is disclosed a trigonometric function generator which may be adapted for use as function generator 43. Other known circuits may be utilized for generating the sine functions in digital form.

Storage means 60 may be any one of numerous commercially available storage means, such as a semiconductor or magnetic core memory. While in the presently preferred embodiment storage means 60 is shown as a separate memory means, it may be a common means with storage means 52. The storage means 60 is adaptable for receiving the results of the Fourier transform performed by converter 58 on lead 59 and storing the complex Fourier coefficients within its memory. The storage means 60 also communicates with the arithmetic means 71 via leads 68 and 69 and also is adaptable for transmitting stored signals on lead 65 to the digital-to-log-analog converter 62. Information which in the presently preferred embodiment comprises the resonant frequencies, may be read into the storage means on lead 67, this lead being coupled to display 63. Output information may be obtained from the storage means 60 via the output lead 72.

In the presently preferred embodiment the location of the poles along the $j\omega$ axis is selected from a display from the highest order "derivative" or convolution of the input signal, such as is shown in FIG. 4c. Typically, the digital data used for the computations has a considerably larger dynamic range than a display means, such as a cathode ray tube. The digital-to-log-analog converter 62 converts the digital information which is to be displayed on display 63 into analog signal, the value of which is a logarithmic function of the digital signal. A circuit for performing this digital-to-log-analog conversion, particularly suitable for use in conjunction with a display, is shown in U.S. Pat. No. 3,670,326. Display 63 which is coupled to converter 62 via lead 66 may be an ordinary cathode ray display or other display means. Once the display is presented, such as the graph shown in FIG. 4c, the frequencies at which the poles occur may be communicated to the storage means 60 via lead 67. Ordinary scaling means may be utilized on the display in order to determine the frequencies of the poles.

Arithmetic means 71 may be a hard-wired digital computation means or may be a general purpose digital computer programmed to solve equations (18) and (19) above. These equations are relatively simple to solve for a digital computer and hence arithmetic means 71 may be readily fabricated from known technology.

In operation, the system of FIG. 3 after $h(t)$ has been determined, multiplies within multiplier 45 the quantity $h(t)$ times the sine function generated by generator 43. This product is communicated to and stored within storage means 52. The results of this first multiplication are transmitted to the Fourier transform converter 58 where the Fourier transform computation is performed and the results of this computation, that is the complex Fourier coefficients, are then stored in storage means 60. The results of the first multiplication $x(t)$. $h(t)$ are then applied to multiplier 45 via lead 48 and are multiplied by the trigonometric function again generated by generator 43, forming the quantity $x^2(t)h(t)$. The results of this multiplication are transmitted to storage means 52 and stored. This second multiplication is, like the first, transmitted to the Fourier transform converter 58 and the Fourier coefficients are again computed and stored in storage means 60. This process is continued until $l$ as defined in the above equations, is equal to the desired number. For the presently preferred embodiment, only two such multiplications are performed and for the purposes of explanation it will assumed that the frequency domain representation of the first two multiplications are stored within storage means 60.

Once the complex Fourier coefficients which resulted from the two multiplication steps have been stored in storage means 60, the $\sigma$ values are determined by solving equation (18) in the arithmetic means 71 for each discrete value of $\omega$. Following this the magnitude and phase angle is computed for each discrete value of $\omega$ by solving equation (19) within the arithmetic means 71. All the values of $\sigma$ and K, including the phase angle information, are then stored in storage means 60. As previously mentioned, since the computation required to calculate the values of $\sigma$ and K are relatively easy to perform, all possible values of these quantities are computed.

Next, the Fourier coefficients which resulted from the second multiplication are communicated to the digital-to-log-analog converter 62 and after being appropriately scaled and converted to analog form, are displayed on display 63. FIG. 4c illustrates such a display. From the display the resonant frequencies or the values for $n$ or $\omega$ at which the poles occur may be readily determined. These values are then communicated to the storage means 60 and used to select the $\sigma$ values and complex K values which correspond to the resonant frequencies. This information may then be obtained on output lead 72.

Note that in equation (18) the correction factor Z was assumed to be unity for the purposes of the above described computations. It has been found that where the trigonometric function is utilized as the weighting factor and where the number of samples N is relatively large, the correction factor will in fact be close to unity. The correction factor Z can be shown to be $$Z = \frac{1 - e^{-(N-1)\sigma}}{1 - e^{-(N+1)\sigma}} \quad (20)$$

Where the correction factor Z may be of significance, it may be determined utilizing the above equation by first assuming that Z is equal to 1 and computing $\sigma$, based on that assumption from equation (18). Then, by utilizing equation (20) the value of the correction factor Z may be computed. Following this the values for $\sigma$ may be recomputed, utilizing equation (18). This process may be continued, depending on the accuracy needed for the correction factor. It should be noted that other correction factors may be utilized other than the one shown in equation (20).

As was stated previously with respect to FIG. 2, the frequency domain representations from converter 23 are communicated to differentiator 24 where the information is "sharpened" as is illustrated in FIGS. 4b and 4c. A method of differentiating the function in the frequency domain is by using finite differencing one-half wavelength apart, that is $$H'(k) = \tfrac{1}{2}[H(k+\tfrac{1}{2}) - H(k-\tfrac{1}{2})] \quad (21)$$

$$H''(k) = \tfrac{1}{4}[2H(k) - H(k+1) - H(k-1)] \quad (22)$$

where $k$ represents the frequency in the frequency domain representation of a sampled, finite duration impulse response. In this method, the first order separator differences the frequencies one-half wavelength apart and the second order separator differences the frequencies one wavelength apart. The ratio of the first and second order differences yields in general an expression of the damping factor $\sigma$ time a correction factor. It has been found, however, that by using for the first order differencing wavelengths that are one frequency apart, i.e.:

$$H'(k) = \tfrac{1}{2}[H(k+1) - H(k-1)] \quad (23)$$

and by dividing $H'(k)$ by $H''(k)$ shown in equation (22) that the correction factor can be reduced or eliminated and that by using the ratio of equations (23) and (22) but employing a wavelength distance $d$ that the digital equivalent of gain can be introduced in the ratio of the separators. As a particular example it can be shown for a sampled, finite duration impulse response $$h(n) = 2Me - \frac{2\pi}{N} an \cos(2\frac{\pi}{N} fn + \phi) \quad (24)$$

where $h(n)$ is a sampled form of $h(t)$, N is the frame size, $a$ is equal to $\sigma$ times a scale factor and $f$ is one resonant frequency of the system that $$H(k) = \frac{M}{N} e^{j\phi} \frac{1 - e^{2\pi(-a+jf)}}{1 - e^{-\frac{2\pi}{N}(-a+jf-jk)}} \quad (25)$$

and using equations (21) and (22)

$$\frac{|H'(k=f)|}{|H''(k=f)|} = \frac{1}{\sin\frac{\pi}{N}} \cdot \frac{1 - e^{-\frac{2\pi}{N}(-a)}}{1 + e^{-\frac{2\pi}{N}(-a)}} \cdot \frac{|1 - e^{-\frac{2\pi}{N}(-a-j)}| |1 - e^{-\frac{2\pi}{N}(-a+j)}|}{|1 - e^{-\frac{2\pi}{N}(-a-\frac{1}{2}j)}| |1 - e^{-\frac{2\pi}{N}(-a+\frac{1}{2}j)}|} \quad (26)$$

If, however, equations (23) and (22) are used $$\frac{|H'(k=f)|}{|H''(k=f)|} = \frac{2}{\tan\frac{\pi}{N}} \cdot \frac{1 - e^{-\frac{2\pi}{N}a}}{1 + e^{-\frac{2\pi}{N}a}} \quad (27)$$

and the correction factor has been eliminated. If the wavelength distance is $d$ instead of $l$ than $$H'(k) = \tfrac{1}{2}[H(k+d) - H(k-d)] \quad (28)$$

$$H''(k) = \tfrac{1}{4}[2H(k) - H(k+d) - H(k-d)] \quad (29)$$

and $$\frac{|H'(k=f)|}{|H''(k=f)|} = \frac{2}{\tan\frac{\pi}{N}d} \cdot \frac{1-e^{-\frac{2\pi}{N}\alpha}}{1+e^{-\frac{2\pi}{N}\alpha}} \qquad (30)$$

For a large frame size N and heavily damped modes, the first order separator represented by equation (28) has a gain of approximately $d$ and the second order separation has a gain of approximately $d^2$. By varying the differing distance, values that differ in a greater number of significant bits are subtracted with the loss of fewer significant bits. The ratio of the separators as shown in equation (30) requires only a simple scale factor correction but allows operating on values with a greater number of significant bits.

Figure 5:
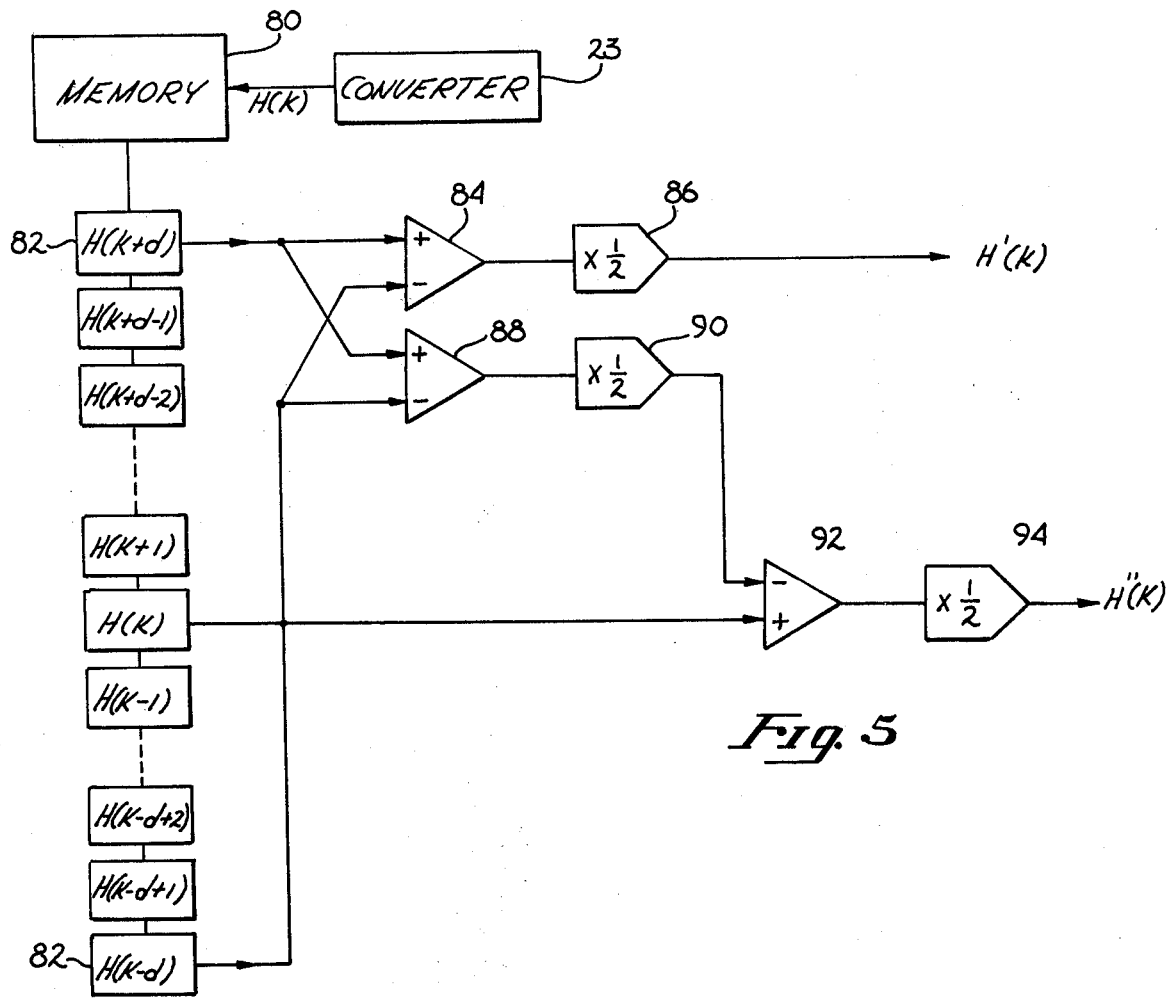
FIG. 5 is a general block diagram illustrating the structure and method by which greater accuracy can be achieved in the determination of the damping factor.

Referring to FIG. 5, a generalized block diagram for performing the above operations to achieve greater accuracy in the determination of the damping factor is illustrated. In FIG. 5, the output of converter 23 is stored in memory 80. Thus memory 80 contains both the real and imaginary parts of H(k). The output from memory 80 is transferred to a bank of shift registers which are capable of holding the complex values of H(k) and which can respond to a transfer clock control signal to transfer their contents to the next register and receive the contents of the previous register. The top register 82 receives from the memory 80 the value H(k+d) and the succeeding register 82 subtracts 1 from $d$ until the content of the bottom register 82 is H(k−d). The contents of the first and last registers 80 are differenced in amplifier 84 and multiplied by 0.5 in the multiplier 86 to yield H'(k) in accordance with equation (28). The contents of the first and last registers 82 are summed in amplifier 88 and multiplied by 0.5 in multiplier 90, differenced in amplifier 92 with the content of the middle register 82 and multiplied by 0.5 in multiplier 94 to yield H''(k) in accordance with equation (29). Since the number are complex, the complex registers 82 may comprise ordinary register pairs, each of which holds the real and imaginary parts of H(k) separately. Similarly the summing, differencing and multiplying circuits may comprise ordinary circuit pairs operating on the real and imaginary parts separately. The outputs of multipliers 86 and 94 are then fed to arithmetic means 28 which calculates the magnitudes and quotients of H'(k) and H''(k) at k=f to yield an expression for the damping factor $\alpha$ as shown in equation (30).

In those instances where the resonances are lightly damped, i.e. $\alpha$ is small, $$\frac{|H'(k=f)|}{|H''(k=f)|} \approx \frac{2}{d}\alpha \qquad (31)$$

Where, however, the discrete Fourier transform is employed, the resonant frequency lies between the integer harmonic frequencies and the nearest frequency is selected for the ratio of the separators, large errors can occur. Thus, if $$f = k_o + p \quad -\tfrac{1}{2} \leq p \leq \tfrac{1}{2} \qquad (32)$$

$$\frac{|H'(k=k_o)|}{|H''(k=k_o)|} \approx \frac{2}{d}\sqrt{\alpha^2+p^2} \qquad (33)$$

and for very lightly damped resonances that lie substantially midway between integer harmonic frequencies, the percentage error can be great. If, however, the complex ratio of the separators is taken instead of the ratio of their magnitudes, then $$\frac{jH'(k=k_o)}{H''(k=k_o)} \approx \frac{2}{d}(\alpha-jp) \qquad (34)$$

where the real part of the complex ratio reflects the desired damping without substantial contamination from the partial frequency and the imaginary part can be used, if desired, to correct the frequency estimate from the nearest integer harmonic value to an interpolated frequency.

Referring to FIG. 6, a generalized block diagram for performing the above operations to achieve greater accuracy in the determination of the damping factor for very lightly damped resonances is illustrated. Since both H'(k) and H''(k) are complex, the complex ratio of jH'(k) and H''(k) can be represented as $$\frac{jH'(k)}{H''(k)} = \frac{j(x'+jy')}{(x''+jy'')} = \frac{x'y''-y'x''}{(x'')^2+(y'')^2} + j\frac{x'x''+y'y''}{(x'')^2+(y'')^2} = \mu+j\nu \qquad (35)$$

Thus the real and imaginary parts of H'(k) and H''(k) can be taken from the outputs of multiplier 86 and 94 in FIG. 5 and used as inputs to the circuit illustrated in FIG. 6 to yield the outputs $u$ and $v$ of equation (35). The circuit of FIG. 6 uses standard components and comprises a plurality of multipliers 96, differential and summing amplifiers 98 and 100, squaring circuits 102 and dividers 104. The output $u$ is proportional to the real part of equation (34) and the output $v$ is porportional to the imaginary part of equation (34).

Thus, a system has been disclosed which permits the locations of the poles and their residues to be determined from empirical data. The system eliminates the use of judgment required in the prior art techniques and permits the location of the poles and their residues to be determined from readily obtainable information.

We claim:

1. A system for determining the natural resonant frequencies associated with a specimen comprising:
   sensor means for sensing the response of the specimen to a predetermined excitation;
   converting means for converting the sensed response of said specimen to a frequency domain representation of said response coupled to said sensor means;
   differentiation means for differentiating said frequency domain representation, coupled to said converting means; and
   peak detection means for detecting the peaks of a signal coupled to said differentiation means;
   whereby the interaction of the poles are minimized through said differentiation such that said resonant frequencies may be determined.

2. A system for determining the natural resonant frequencies associated with a specimen comprising:
   sensor means for sensing the response of said specimen to a known excitation;
   function generating means for generating a predetermined function;

multiplication means for multiplying the sensed response of said specimen by said predetermining function coupled to said sensor means and said function generating means;

converting means for converting the output of said multiplication means to a frequency domain representation coupled to said multiplication means; and peak direction means for detecting the peak of a signal coupled to said converting means;

whereby the interaction of the peaks are minimized through said multiplication and the conversion to the frequency domain such that the resonant frequencies may be determined.

3. The system defined in claim 2 wherein said multiplication means also multiplies said sensed response by the square of said predetermined function.

4. The system defined in claim 3 wherein said frequency domain representation is the Fourier transform.

5. The system defined in claim 4 wherein said predetermined function is a ramp function.

6. The system defined in claim 4 wherein said predetermined function is a sine function.

7. The system defined in claim 2 wherein said peak detection means includes a display means.

8. A method for determining the natural resonant frequencies of a specimen including the steps of:

determining the response of said specimen to excitation with a sensing means;

converting said response of said specimen to said excitation to a frequency domain representation of said response with a computer means;

differentiating said converted response with a differentiating means; and selected the peaks of said differentiated, converted response;

whereby the location of said peaks is representative of the natural resonant frequencies of said specimen.

9. The method defined in claim 8 wherein at least two successive differentiations are performed prior to the selection of the said peaks.

10. A method for determining the natural resonant frequencies of a specimen including the steps of:

determining the response of said specimen to an excitation;

generating a predetermined function with a generating means;

combining said predetermined function with said response to said specimen to said excitation with an electrical means;

converting the results of said combining steps to a frequency domain representation with a computer means; and, selecting the peaks of said frequency domain representation;

whereby the peaks are representative of the natural resonant frequencies of said specimen.

11. A system for determining the location of poles and their residues in a complex s-plane of a specimen comprising;

sensing means for sensing the response of said specimen to an excitation;

converting means for converting the sensed reponse of said impulse to a frequency domain representation of said response, coupled to said sensing means;

differentiation means for differentiating said frequency domain representation, coupled to said converting means;

peak detection means for detecting the peaks of a signal, coupled to said differentiation means; and, arithmetic means coupled to said peak detection means and differentiation means for performing arithmetic computations;

wherein said arithmetic means may compute the location of the poles and their residues from the information supplied from said differentiation means and peak detection means.

12. The system defined in claim 11 wherein said differentiation means generates two successive derivatives of said frequency domain representation and where said two successive derivatives are utilized by said arithmetic means for computing the location of the poles and their residues.

13. The system defined in claim 12 wherein said frequency domain representation is the Fourier transform.

14. A system for determining the location of poles in a complex s-plane and their residue of a specimen comprising:

sensing means for sensing the response of said specimen to a predetermined excitation;

function generation means for generating a predetermined function;

combining means for combining the sensed response of said specimen with said predetermined function, coupled to said sensing means and said function generation means;

combining means for converting the output of said combining means to a frequency domain representation, coupled to said combining means;

peak detection means for detecting the peaks of a signal, coupled to said converting means; and, arithmetic means for performing arithmetic computations coupled to said converting means and to said peak detection means;

whereby said arithmetic means from the data furnished it by said converting means and peak detection means may compute the location of the poles and their residues.

15. The system defined by claim 14 wherein said frequency domain representation is a Fourier transform.

16. The system defined by claim 15 wherein said function generator generates a sine function.

17. The system defined by claim 16 wherein a storage means is coupled between said arithmetic means and said converting means and peak detection means.

18. The system defined in claim 14 wherein said arithmetic means employs finite differencing in the computation of the location of the poles and their residues.

19. The system defined by claim 18 wherein at least the square of said predetermined function is combined with the response of said specimen to said predetermined excitation.

20. The system defined by claim 14 wherein two consecutive powers of said predetermined function are combined by said combining means and utilized by said arithmetic means for determining said location of the poles and their residues.

21. The system defined by claim 14 including means for generating powers of said predetermined function.

22. The system defined by claim 11 wherein said sensing means includes data conditioner means for converting a frequency domain representation of a response to a time domain representation.

23. The system defined by claim 14 wherein said sensing means includes data conditioner means for converting a frequency domain representation of a response to a time domain representation.

24. The system defined in claim 1 wherein said differentiation means employs finite differencing.

25. A system for determining the location of poles in a complex s-plane and their residues of an input signal comprising:
function generating means for generating a predetermined function;
combining means for combining said input signal with said predetermined function, coupled to said function generation means;
converting means for converting the output of said combining means to a frequency domain representation, coupled to said combining means;
peak detection means for detecting the peaks of a signal, coupled to said converting means; and, arithmetic means for performing arithmetic computations coupled to said converting means and to said peak detection means;
whereby said arithmetic means from the data furnished it by said converting means and peak detection means may compute the location of the poles and their residues.

26. The system defined by claim 25 wherein said arithmetic means employs finite differencing.

27. A system for determining the location of poles and their residues in a complex s-plane of an input signal comprising:
converting means for converting said input signal to a frequency domain representation of said input signal;
differentiation means for differentiating said frequency domain representation, coupled to said converting means;
peak detection means for detecting the peaks of a signal, coupled to said differentiation means; and,
arithmetic means coupled to said peak detection means and differentiation means for performing arithmetic computations;
whereby said arithmetic means may compute the location of the poles and their residues from the information supplied from said differentiation means and peak detection means.

28. A system for determining the location of poles and their residues in a complex s-plane of an input signal comprising:
converting means for converting said input signal to a frequency domain representation of said input signal;
differentiation means coupled to said converting means for differentiating said frequency domain representation, coupled to said converting means, said differentiation means generating two successive derivatives of said frequency domain representation by use of finite differencing employing the same differencing distance in deriving both of said derivatives;
peak detection means for detecting the peaks of a signal, coupled to said differentiation means; and,
arithmetic means coupled to said peak detection means and differentiation means for performing arithmetic computations;
whereby said arithmetic means may compute the location of said poles and their residues from the information supplied from said differentiation means and peak detection means.

29. The system of claim 28 wherein said differentiation means includes means for producing frequency domain representations at a preselected frequency and at frequencies higher and lower than said preselected frequency by a preselected amount; and
means for differencing said frequency domain representations to obtain said successive derivatives.

30. The system of claim 29 wherein said means for obtaining said successive derivatives includes means for producing said frequency domain representation at said higher frequency and shift register means for producing frequency domain representations at said preselected frequency and said lower frequency.

31. The system of claim 28 wherein said arithmetic means includes means for computing the complex ratio of said successive derivatives, the real part thereof being proportional to the damping factor associated with said poles.

32. In a system for determining the location of poles and their residues in a complex s-plane of an input signal the improvement comprising:
converting means for converting said input signal to a frequency domain representation of said input signal;
differentiation means coupled to said converting means for differentiating said frequency domain representation, coupled to said converting means; said differentiation means generating two successive derivatives of said frequency domain representation by use of finite differencing employing the same differencing distance in deriving both of said derivatives;
arithmetic means coupled to said differentiation means for performing arithmetic computations;
whereby said arithmetic means may compute the damping factor associated with said poles from the information supplied from said differentiation means.

33. The system of claim 32 wherein said arithmetic means includes means for computing the complex ratio of said successive derivatives, the real part thereof being proportioned to the damping factor associated with said poles.

* * * * *